United States Patent [19]

Sandhu et al.

[11] Patent Number: 5,381,302
[45] Date of Patent: Jan. 10, 1995

[54] CAPACITOR COMPATIBLE WITH HIGH DIELECTRIC CONSTANT MATERIALS HAVING A LOW CONTACT RESISTANCE LAYER AND THE METHOD FOR FORMING SAME

[75] Inventors: Gurtej S. Sandhu; Pierre C. Fazan, both of Boise, Id.

[73] Assignee: Micron Semiconductor, Inc., Boise, Id.

[21] Appl. No.: 104,525

[22] Filed: Aug. 10, 1993

Related U.S. Application Data

[63] Continuation-in-part of Ser. No. 44,331, Apr. 2, 1993.

[51] Int. Cl.$^6$ .............................................. H01G 1/01
[52] U.S. Cl. ..................... 361/305; 361/303; 361/311; 361/313; 361/321.1; 257/306; 257/310
[58] Field of Search ............... 361/303, 305, 311, 312, 361/313, 321.1, 322; 427/79, 81; 437/52, 60; 365/145, 149; 257/303, 304, 305, 306, 310, 532, 295

[56] References Cited

U.S. PATENT DOCUMENTS

| | | | |
|---|---|---|---|
| 5,005,102 | 4/1991 | Larson | 361/313 |
| 5,046,043 | 9/1991 | Miller et al. | 365/145 |
| 5,111,355 | 5/1992 | Anand et al. | 361/313 |
| 5,185,689 | 2/1993 | Maniar | 361/313 |
| 5,198,384 | 3/1993 | Dennison | 437/52 |
| 5,248,628 | 9/1993 | Okabe et al. | 437/60 |

Primary Examiner—Bruce A. Reynolds
Assistant Examiner—Gregory L. Mills
Attorney, Agent, or Firm—Susan B. Collier

[57] ABSTRACT

The invention is a storage cell capacitor and a method for forming the storage cell capacitor having a storage node electrode comprising a barrier layer interposed between a conductive plug and an oxidation resistant layer. A layer of titanium silicide is fabricated to lie between the conductive plug and the oxidation resistant layer. A thick insulative layer protects the sidewalls of the barrier layer during the deposition and anneal of a dielectric layer having a high dielectric constant. The method comprises forming the conductive plug in a thick layer of insulative material such as oxide or oxide/nitride. The conductive plug is recessed from a planarized top surface of the thick insulative layer. Titanium is deposited and a rapid thermal anneal is performed. The titanium reacts with silicide of the conductive plug to form TiSi at the bottom of the recess. Unreacted Ti is removed. The barrier layer is then formed in the recess. The process is continued with a formation of an oxidation resistant conductive layer and the patterning thereof to complete the formation of the storage node electrode. Next a dielectric layer having a high dielectric constant is formed to overly the storage node electrode and a cell plate electrode is fabricated to overly the dielectric layer.

15 Claims, 18 Drawing Sheets

CAPACITOR COMPATIBLE WITH HIGH DIELECTRIC CONSTANT MATERIALS HAVING A LOW CONTACT RESISTANCE LAYER AND THE METHOD FOR FORMING SAME

The application is a continuation-in-part of copending application entitled "A METHOD FOR FORMING A STORAGE CELL CAPACITOR COMPATIBLE WITH HIGH DIELECTRIC CONSTANT MATERIALS", with U.S. Ser. No. 08/044,331, filed on Apr. 2, 1993, and is a sister application to the application filed simultaneously herewith entitled "A CAPACITOR COMPATIBLE WITH HIGH DIELECTRIC CONSTANT MATERIALS HAVING TWO INDEPENDENT INSULATIVE LAYERS AND THE METHOD FOR FORMING SAME" and having Ser. No. 08/104,524.

FIELD OF THE INVENTION

This invention pertains to semiconductor technology, and more particularly to storage cell capacitors for use in dynamic random access memories.

BACKGROUND OF THE INVENTION

As memory devices become more dense it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer between the storage node electrode and the cell plate capacitor electrodes. The dielectric constant is a value characteristic of a material and is proportional to the amount of charge that can be stored in the material when it is interposed between two electrodes. $Ba_xSr_{(z-x)}TiO_3$ [BST], $BaTiO_3$, $SrTiO_3$, $PbTiO_3$, $Pb(Zr,Ti)O_3$ [PZT], $(Pb,La)Zr,Ti)O_3$ [PLZT], $(Pb,La)TiO_3$ [PLT], $KNO_3$, and $LiNbO_3$ are among some of the high dielectric constant materials that can be used in this application. These materials have dielectric constant values above 50 and will likely replace the standard $Si_3N_4$, $SiO_2/SiN_4$, $Si_3N_4/SiO_2$, or $SiO_2/Si_3N_4/SiO_2$ composite films used in 256 kilobits (Kb) to 64 megabits (Mb) generations of DRAMs. $Si_3N_4$ and $SiO_2/Si_3N_4$ composite films have dielectric constant values of 7 or less. The storage node and cell plate electrodes are also referred to as first and second electrodes.

Unfortunately high dielectric constant materials are incompatible with existing processes and can not be simply deposited on a polysilicon electrode as was the case for the lower dielectric constant materials, such as $Si_3N_4$ and $SiO_2/Si_3N_4$ composite layers. This incompatibility is a result of the $O_2$ rich ambient present during the high dielectric constant material deposition or during annealing steps. The $O_2$ oxidizes portions of the materials formerly used for the storage node plate. Also the capacitors employing the former materials undergo physical degradation during thermal cycles due to the diffusion of the cell plate material into the dielectric.

In the storage cell capacitor incorporating BST, described in the IDEM-91 article entitled, A STACKED CAPACITOR WITH $(Ba_xSr_{1-x})TiO_3$ FOR 256M DRAM by Koyama et al., some of these problems are resolved. The storage node electrode typically comprises a layer of platinum overlying a tantalum barrier layer which, in turn, overlies a polysilicon plug. Platinum is used as the upper portion of the first electrode since it will not oxidize during a BST deposition or subsequent anneal. An electrode that oxidizes would have a low dielectric constant film below the BST, thereby negating the advantages provided by the high dielectric constant material. The tantalum layer is introduced to avoid Si and Pt inter-diffusion and to prevent the formation of $SiO_2$ on top of the platinum surface. In addition, the platinum protects the top surface of the tantalum from strong oxidizing conditions during the BST deposition. FIG. 1 depicts the stacked storage node electrode of the related art comprising tantalum 1, platinum 2 (Ta/Pt) overlying the polysilicon plug 3.

However, the sidewalls 4 of the tantalum film 1 formed during this process are subject to oxidation during the subsequent deposition of the BST layer. Since the tantalum 1 oxidizes the polysilicon plug 3 is also susceptible to oxidation. When portions of the polysilicon plug 3 and tantalum 1 are consumed by oxidation the capacitance of the storage cell capacitor is decreased since the storage node electrode is partially covered by a low dielectric constant film. Therefore the memory device cannot be made as dense.

In addition, the storage node contact resistance increases drastically between the polysilicon plug and the tantalum barrier layer as a result of degradation of the tantalum barrier layer during deposition of BST and other high dielectric constant materials.

OBJECTS OF THE INVENTION

An object of the invention is to increase density of a memory device by increasing capacitance of storage cell capacitors.

A further object of the invention is decreased contact resistance between a polysilicon electrode and a barrier layer and reduced degradation of the barrier layer.

SUMMARY OF THE INVENTION

The storage cell capacitor of the invention features a storage node electrode having a barrier layer which prohibits diffusion of atoms. The barrier layer may be titanium nitride or another material which prohibits silicon diffusion. The barrier layer is interposed between a conductive plug and a non-oxidizing conductive material such as platinum. A dielectric layer, typically $Ba_xSr_{1-x}TiO_3$ [BST], is deposited on the non-oxidizing material. The barrier layer is surrounded on its sides by an insulative layer.

The insulative layer and the non-oxidizing material protect the barrier layer from oxidizing during the deposition and anneal of the BST thereby also eliminating oxidation of the conductive plug. By eliminating oxidation of the barrier layer and the conductive plug capacitance is maximized, and the contact resistance is not affected.

The invention also features a low contact resistance material lying between the conductive plug and the barrier layer.

The invention is a storage node capacitor and a method for forming the storage node capacitor having a storage node electrode comprising a barrier layer interposed between a conductive plug and an oxidation resistant conductive layer. The method comprises forming the conductive plug in a thick layer of insulative material such as oxide or oxide/nitride. The conductive plug is recessed from a planarized top surface of the thick insulative layer. A low contact resistance material if formed at the base of the recess. The barrier layer is then formed in the recess. The process is continued with a formation of an oxidation resistant conductive layer and the patterning thereof to complete the formation of the storage node electrode.

Next a dielectric layer, typically having a high dielectric constant, is formed to overly the storage node electrode and a cell plate electrode is then fabricated to overly the dielectric layer.

Since the barrier layer is protected during the formation of the dielectric layer by both the oxidation resistant conductive layer and the thick insulative layer there is no oxidation of the barrier layer or the contact plug thereby maximizing capacitance of the storage node and reducing high contact resistance issues,

BRIEF DESCRIPTION OF THE DRAWINGS

FIGS. 2–11 are cross-sectional views of a portion of a partially processed semiconductor wafer depicting the steps of the invention for fabricating a storage cell capacitor.

FIG. 2 depicts field-effect transistors overlying a silicon substrate and wordlines overlying field oxide.

FIG. 3 is the wafer portion of FIG. 2 following the deposit of an undoped thick oxide layer and planarization thereof.

FIG. 4 is the wafer portion of FIG. 3 following the masking and subsequent etching of the deposited oxide layer to form self-aligned openings.

FIG. 5 is the wafer portion of FIG. 4 following the formation of polysilicon plugs in the openings and the removal of the mask shown in FIG. 4.

FIG. 6 is the wafer portion of FIG. 5 following the recessing of the polysilicon plug in the thick oxide layer.

FIG. 7 is the wafer portion of FIG. 6 following a deposition of titanium.

FIG. 8 is the wafer portion of FIG. 7 following an anneal and removal of unreacted Titanium.

DETAILED DESCRIPTION OF THE PREFERRED EMBODIMENT

The method for fabricating the storage cell capacitor of the invention is shown pictorially in FIGS. 2–11.

Figure 1:
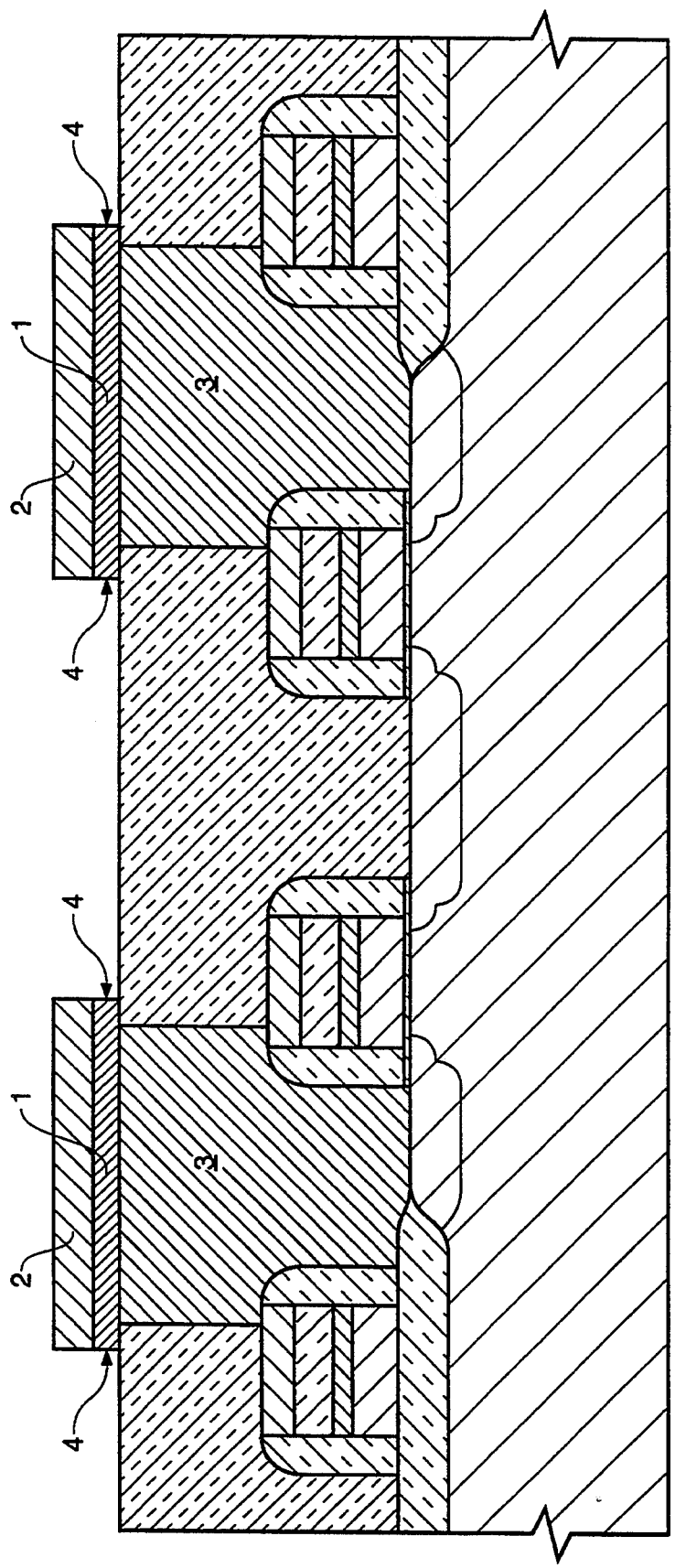
FIG. 1 is a cross-sectional view of a portion of a partially processed semiconductor wafer of the related art.
Figure 2:
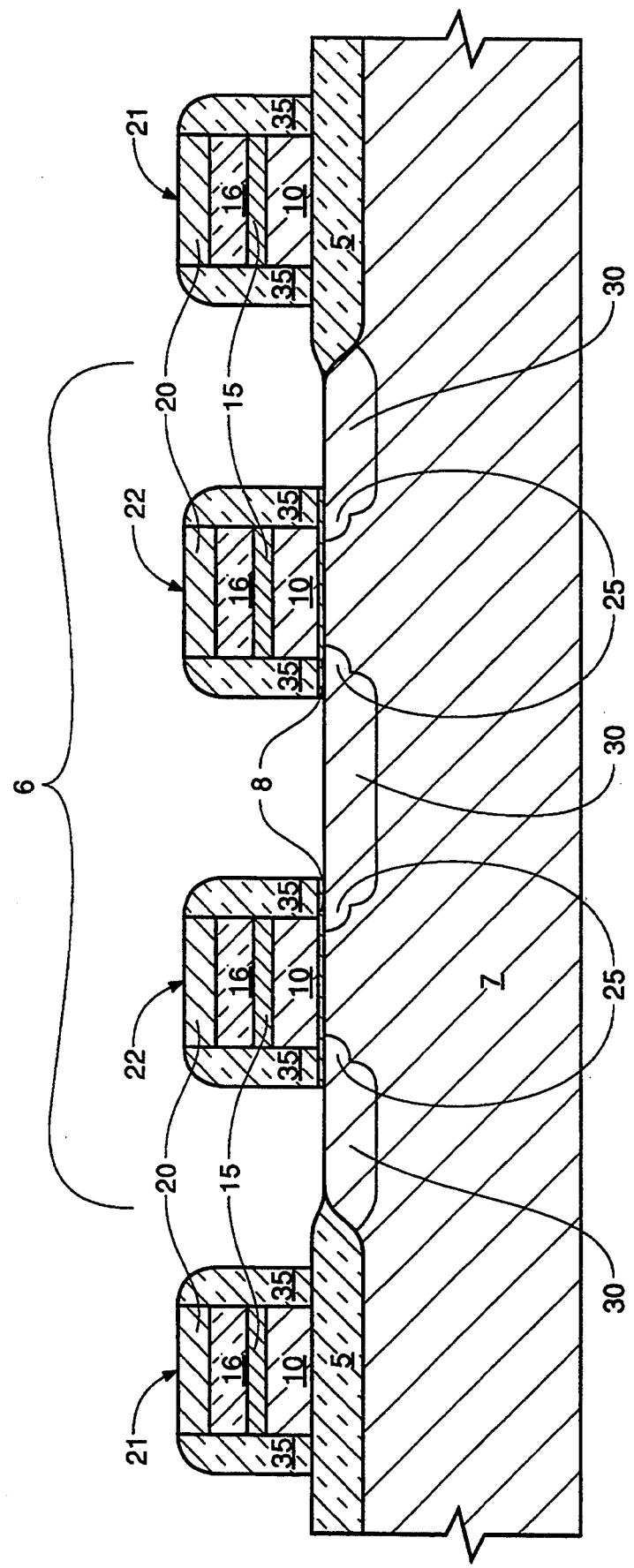

Referring to FIG. 2, a cross-sectional view of an in-process dynamic random access memory (DRAM) cell is shown following conventional local oxidation of silicon (LOCOS) or special IX)COS processing which creates substantially planar field oxide regions 5 (created using modified LOCOS or trench isolation processes) and future active areas 6 (those regions of the substrate not covered by field oxide) on a silicon substrate 7. The creation of the field oxide is preceded or followed by a thermally grown dielectric layer 8 of silicon oxide. The depicted cell is one of many cells that are fabricated simultaneously and comprise a memory array. Following the creation of the field oxide region 5 and dielectric layer 8 a first conductively doped polysilicon layer 10, a metal silicide layer (Wsix) 15, an oxide layer 16, and a thick nitride layer 20 are deposited. The thick nitride layer 20 will function as an etch stop during the storage node buried contact etch, thus allowing self-alignment if desired. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 8. The lightly-doped regions 25 are created utilizing a phosphorus or arsenic implant. Deposition, densification and a reactive ion etch (RIE) of a silicon nitride spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

The formation of the FETs 22 and wordlines 21 as described are exemplary of one application to be used in conjunction with the present embodiment of the invention. Other methods of fabrication and other applications are also feasible and perhaps equally viable.

Figure 3:
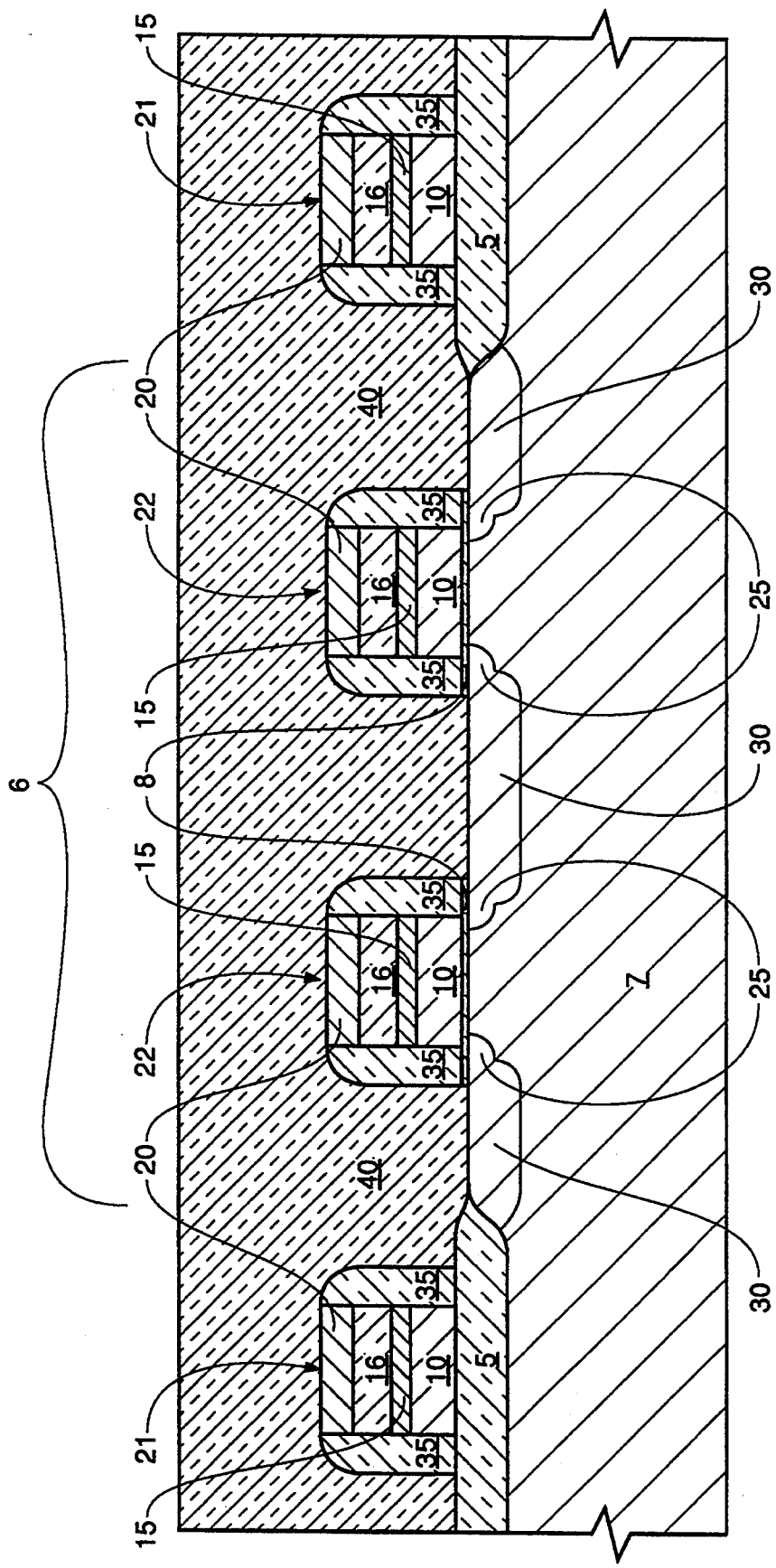

In FIG. 3 a thick insulative conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide 40 is planarized, preferably chemical mechanically planarized (CMP), in order to provide a uniform height. Optionally nitride, oxynitride or another suitable material may be deposited as the insulative layer.

In general, CMP involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. Such apparatus for polishing are disclosed in U.S. Pat. Nos. 4,193,226 and 4,811,522 which are herein incorporated by reference. Another such apparatus is manufactured by Westech Engineering and is designated as a Model 372 Polisher.

At this juncture buried digit lines may be fabricated as described in U.S. Pat. No. 5,168,073 herein incorporated by reference. In the case where the buried digit lines are formed by the method described in U.S. Pat. No. 5,168,073 an initial thick oxide layer is deposited and planarized and then overlaid with a relatively thick $Si_3N_4$ layer which is also planarized. These two layers serve the same function as the oxide layer 40 and may be used in place of Oxide layer 40 even in the case where buried digit lines are not formed. When buried digit lines are formed the thick oxide is typically deposited prior to the digit line formation and the Si3N4 is deposited subsequent to the digit line formation. In this case where the tick insulative layer is comprised only of oxide it is possible for oxygen to diffuse through the oxide. By overlying the oxide with Si3N4 it is possible to prohibit oxygen diffusion though the oxide.

Figure 4:
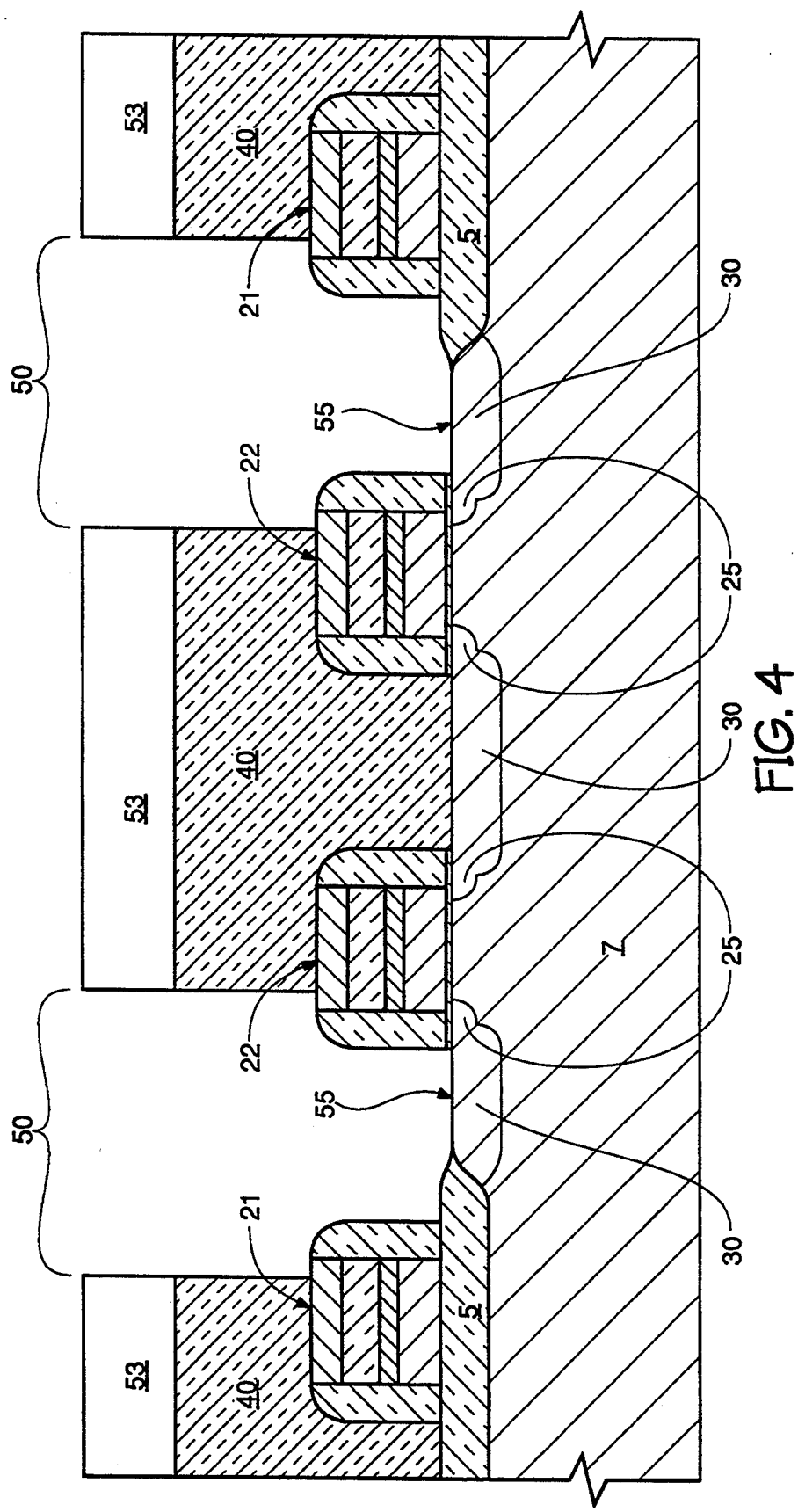

Referring to FIG. 4, mask 53 defines self-aligned substrate contact area 55. The oxide 40 is etched, preferably dry etched, to form a self-aligned openings 60 exposing the contact areas 55 of the substrate 7.

Figure 5:
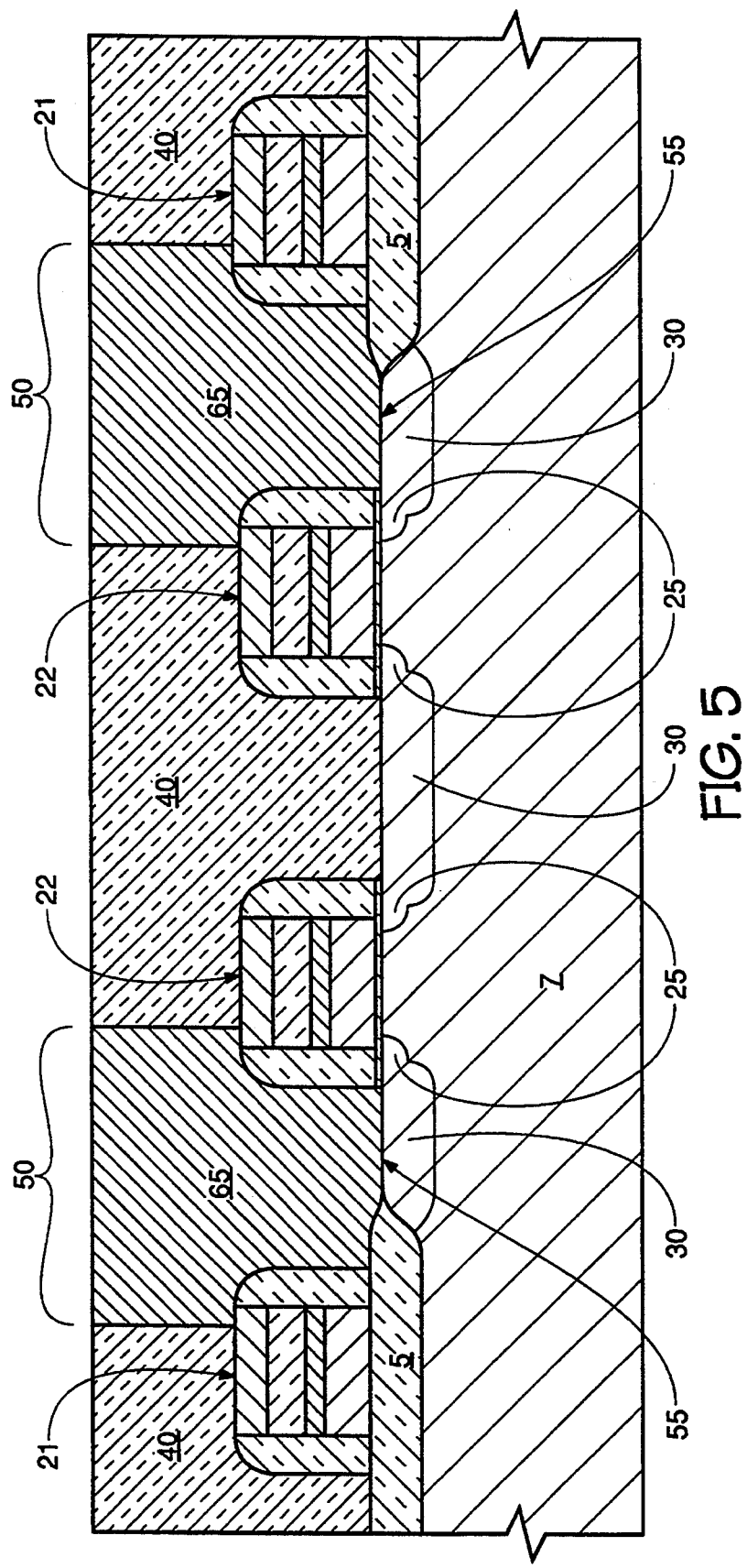

Referring to FIG. 5, in order to provide electrical communication between the substrate 7 and the storage cell capacitor a polysilicon plug 65 is formed in each opening 60. The actual method used to form the polysilicon plugs 65 is not critical, two options being a selective silicon growth from the contact area 55 or a in-situ doped polysilicon deposition and subsequent etch back or CMP back.

Figure 6:
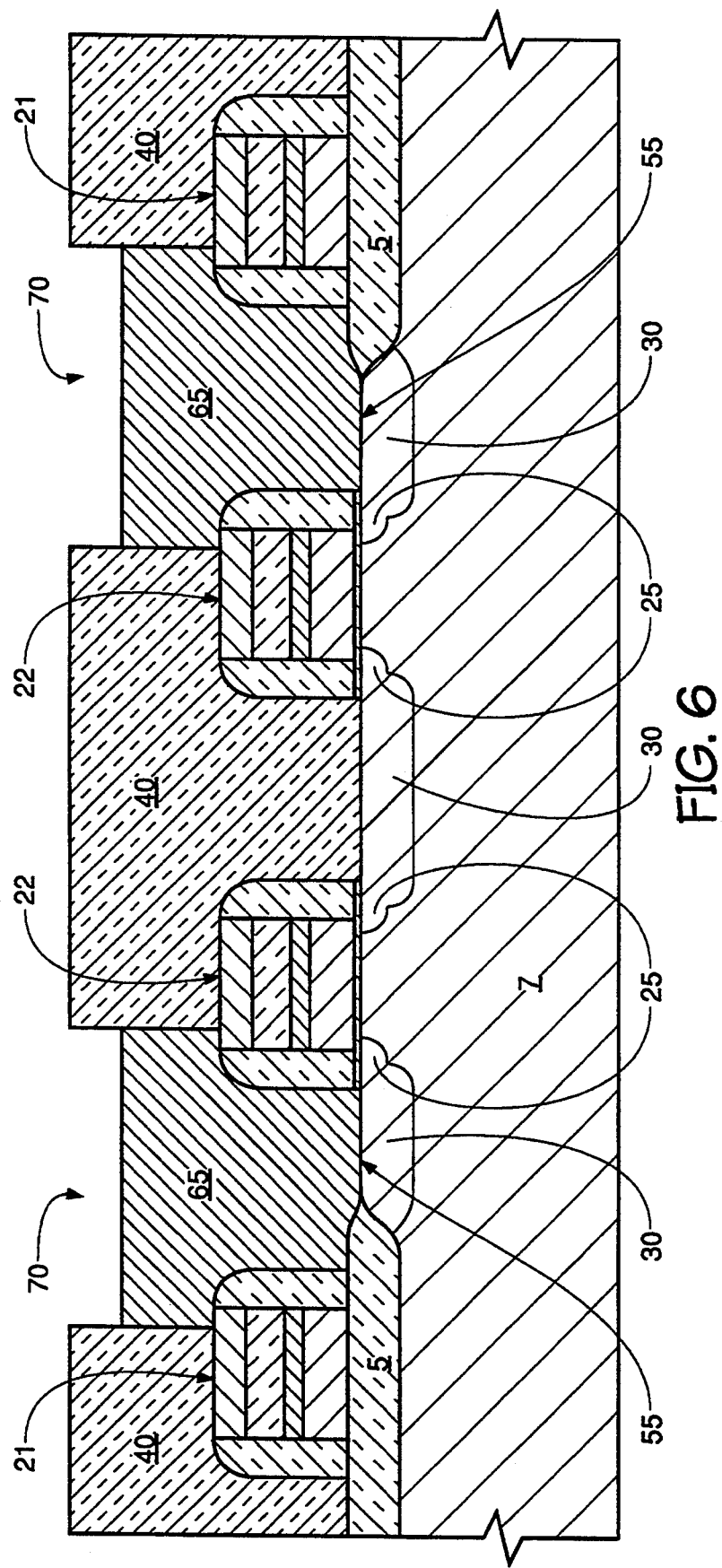

Referring now to FIG. 6, an upper portion of the polysilicon plugs 65 is removed during a dry etch in order to form a recesses 70, Typically, this etch back is 50 to 400 nano meters (nm). In a case where the polysilicon plugs 65 are formed during a selective silicon growth it is possible to form the recess 70 by controlling the growth.

Figure 7:
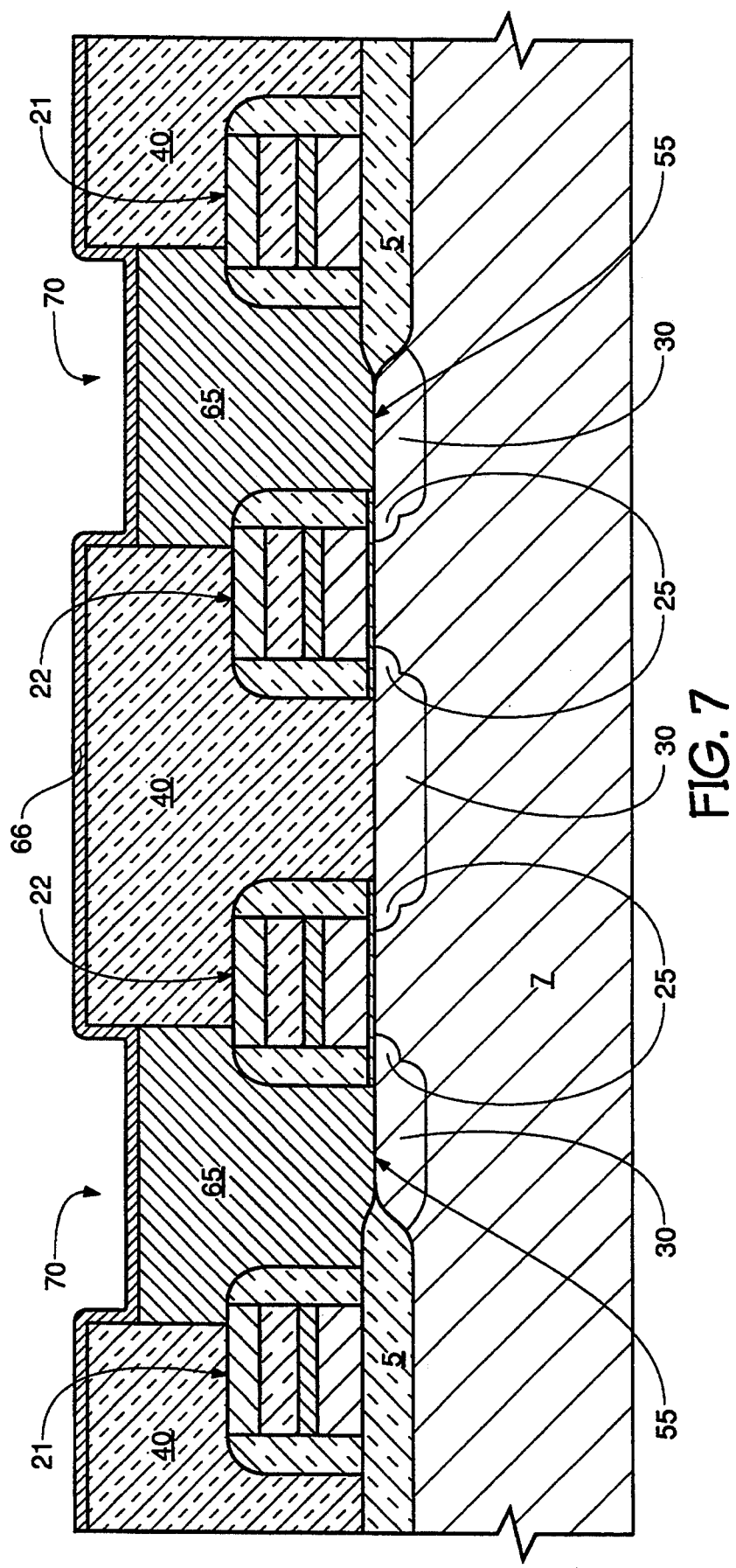

Referring now to FIG. 7, a first barrier layer of titanium 66 is deposited to overly oxide 40 and polysilicon plug 65. A thermal anneal is performed and the titanium 66 in contact with the polysilicon plug reacts with the polysilicon to form titanium silicide. It is possible to perform the anneal in nitrogen. In this case the titanium still reacts with the polysilicon to form titanium silicide, and the titanium which is not in contact with the polysilicon plug reacts with the nitrogen to form TiN. In addition a thin layer of nitrogen is formed overlying the titanium silicide.

In addition to titanium other refractory metals may be used. These refractory metals may be chosen from the list of refractory metals comprising W, Co, Ta, and Mo.

Alternately a metal nitride, such as TiN, may be deposited instead of a refractory metal. The refractory metal and the metal nitride are both capable of reacting with the polysilicon plug to form a silicide during an anneal.

Figure 8:
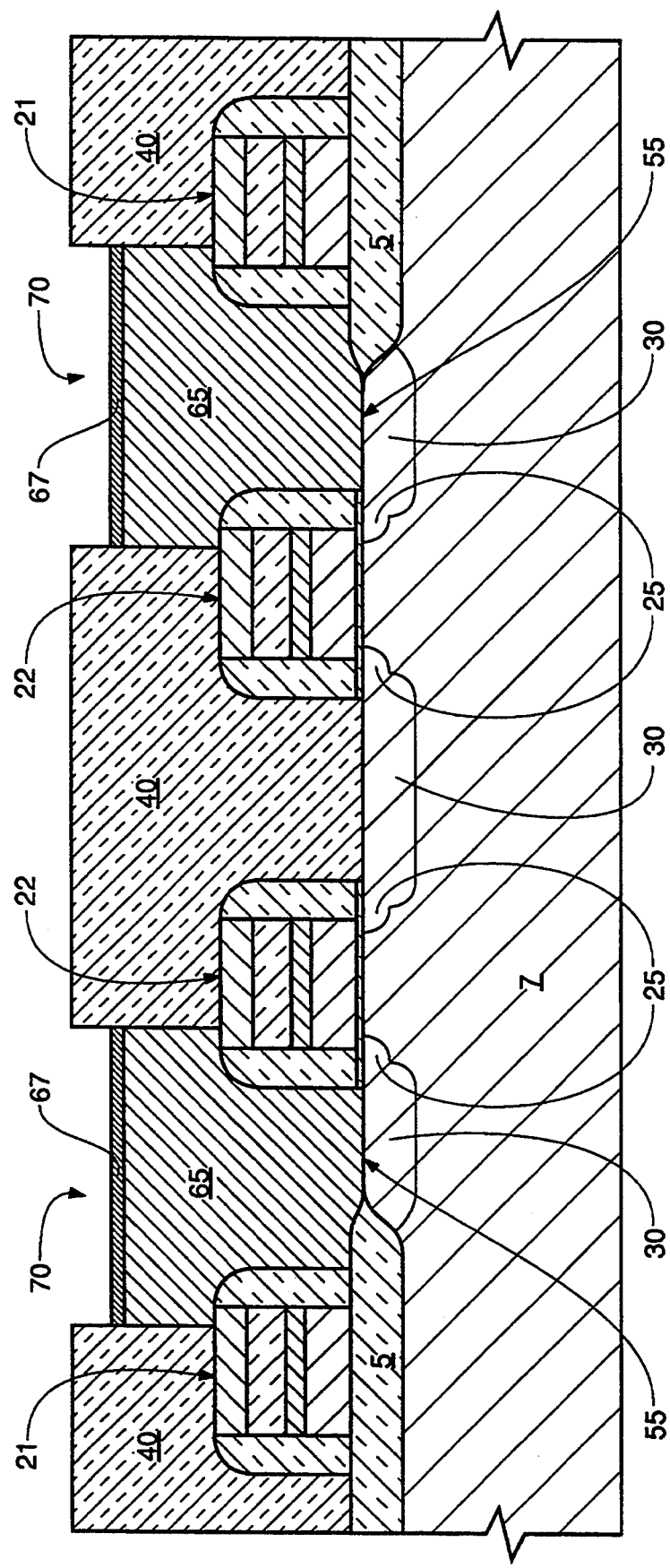

Referring now to FIG. 8, the unsilicided layer (the unreacted titanium in the case of a non-nitrogen anneal, or the TiN, in the case of a nitrogen anneal) and the thin nitrogen layer have been removed during a wet etch. The titanium silicide 67 overlying the polysilicon plug 65 is retained during the etch.

Figure 9A:
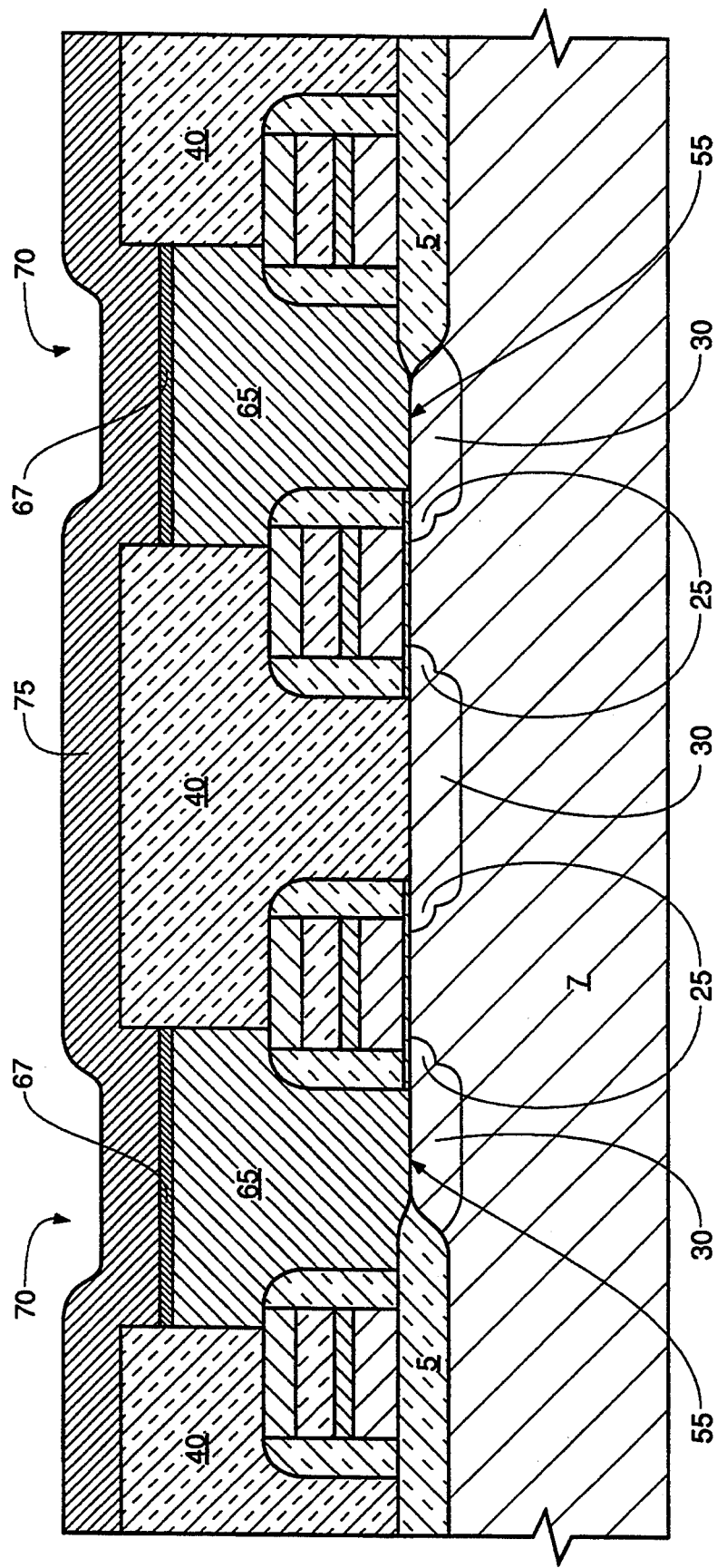
FIGS. 9A and 9B are wafer portions of FIG. 8 followings the deposition of a titanium nitride layer.
Figure 9B:
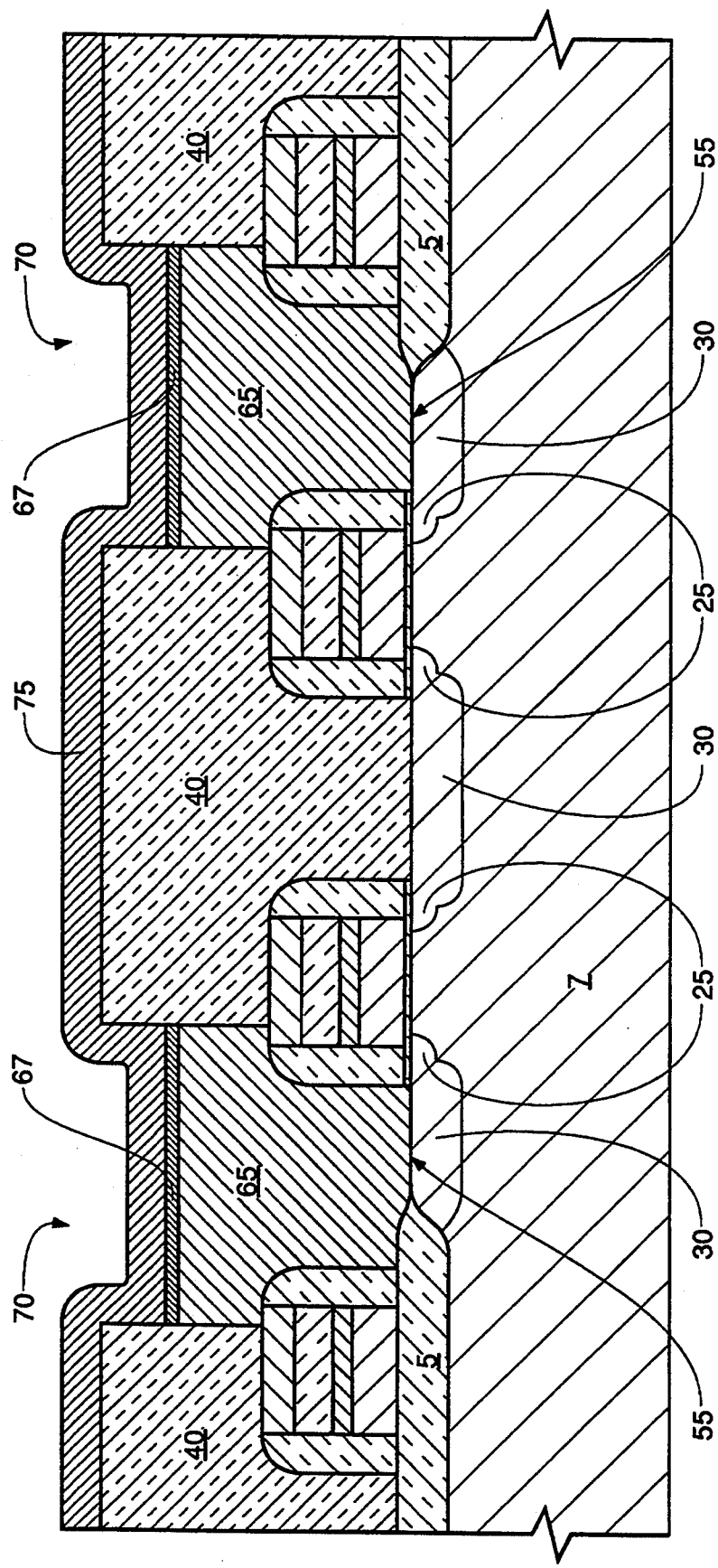

Referring to FIGS. 9A and 9B, a second barrier layer, titanium nitride layer 75, is formed by a chemical vapor deposition (CVD) or a sputtering process performed at room temperature. In a first embodiment, shown in FIG. 9A, the titanium nitride layer 75 has a thickness greater than or equal to the depth of recess 70 remaining after the removal of the unreacted titanium 66. The titanium silicide layer lowers a contact resistance between the polysilicon plug 65 and the titanium nitride layer 75. The titanium nitride layer 75 provides a barrier against silicon diffusion of the polysilicon plug 65 and the titanium silicide layer 67 during subsequent high temperature anneals. Other materials capable of prohibiting silicon diffusion may be used in place of titanium nitride. These materials may be chosen from refractory metals, conductive metal oxides or metal nitrides and must be capable of prohibiting silicon diffusion. Some examples include tantalum, TaN, Ti, RuO2 and Ru.

In a second embodiment, shown in FIG. 9B, the titanium nitride layer 75 is formed such that its thickness is less than the depth of the recess 70 remaining after the removal of the unreacted titanium 66. In this second embodiment the storage cell capacitor gains more vertical area thereby increasing capacitance.

Figure 10A:
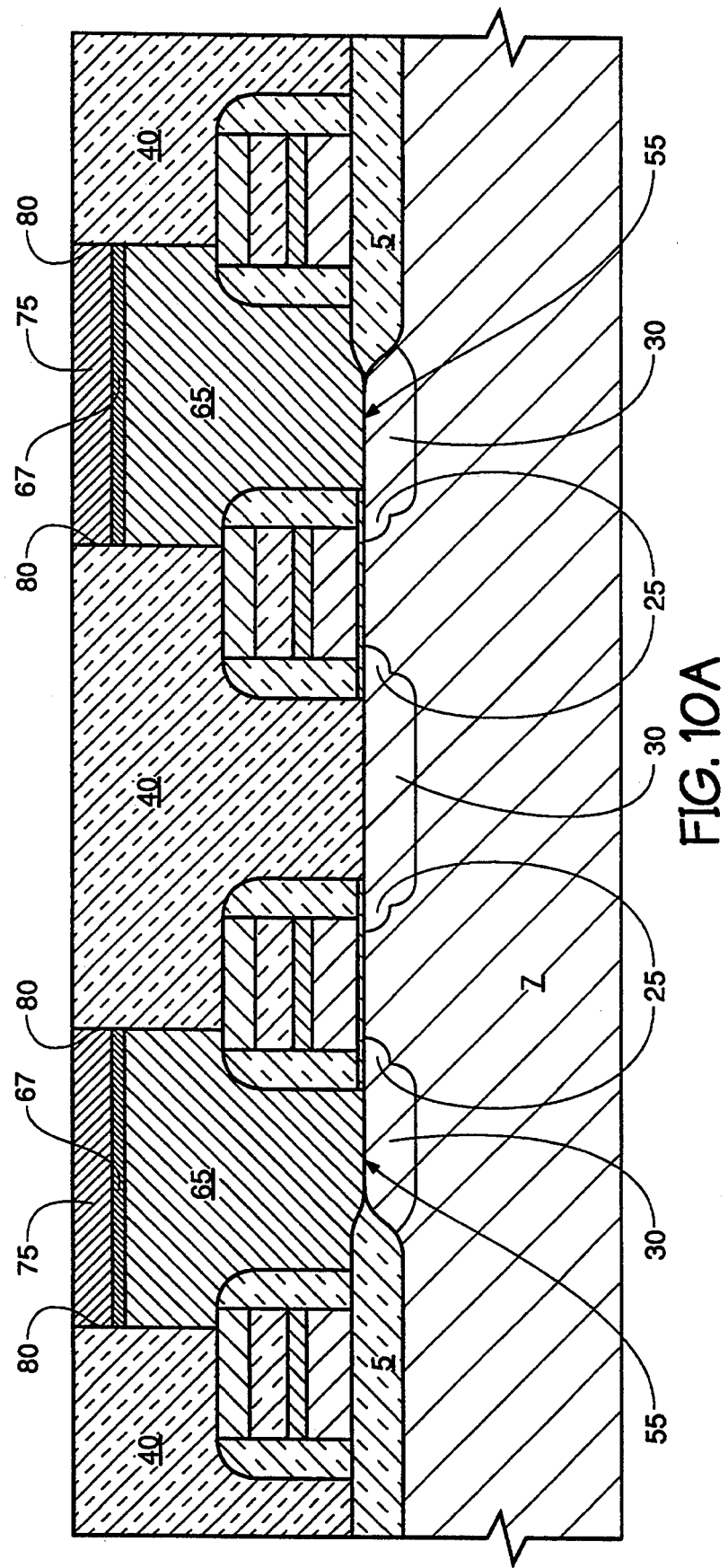
FIGS. 10A and 10B are wafer portions of FIGS. 9A and 9B following the planarization of the titanium nitride layer.
Figure 10B:
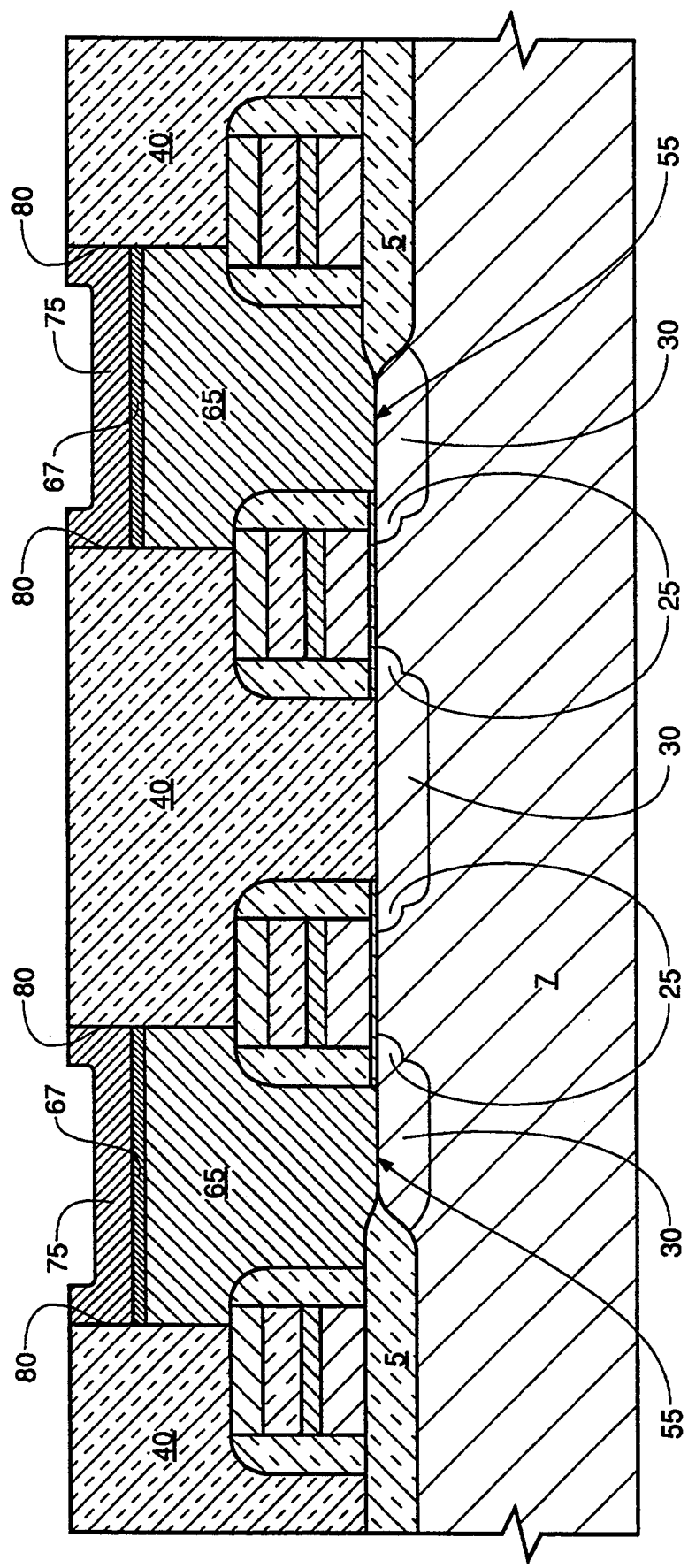

Referring to FIGS. 10A and 10B, the titanium nitride layer 75 of FIGS. 9A and 9B, respectively, is planarized, preferably by CMP, in order to expose at least the oxide layer 40 and in order to retain titanium nitride 75 in recesses 70 overlying the titanium silicide 67. Portions of the oxide layer 40 may be planarized during this step. It is important, of course to retain a sufficient depth of titanium nitride 75 in order to inhibit silicon diffusion. It can be seen that only the upper surface of the titanium nitride layer 75 is exposed and that the titanium nitride sidewalls 80 are protected by the oxide layer 40.

Figure 11A:
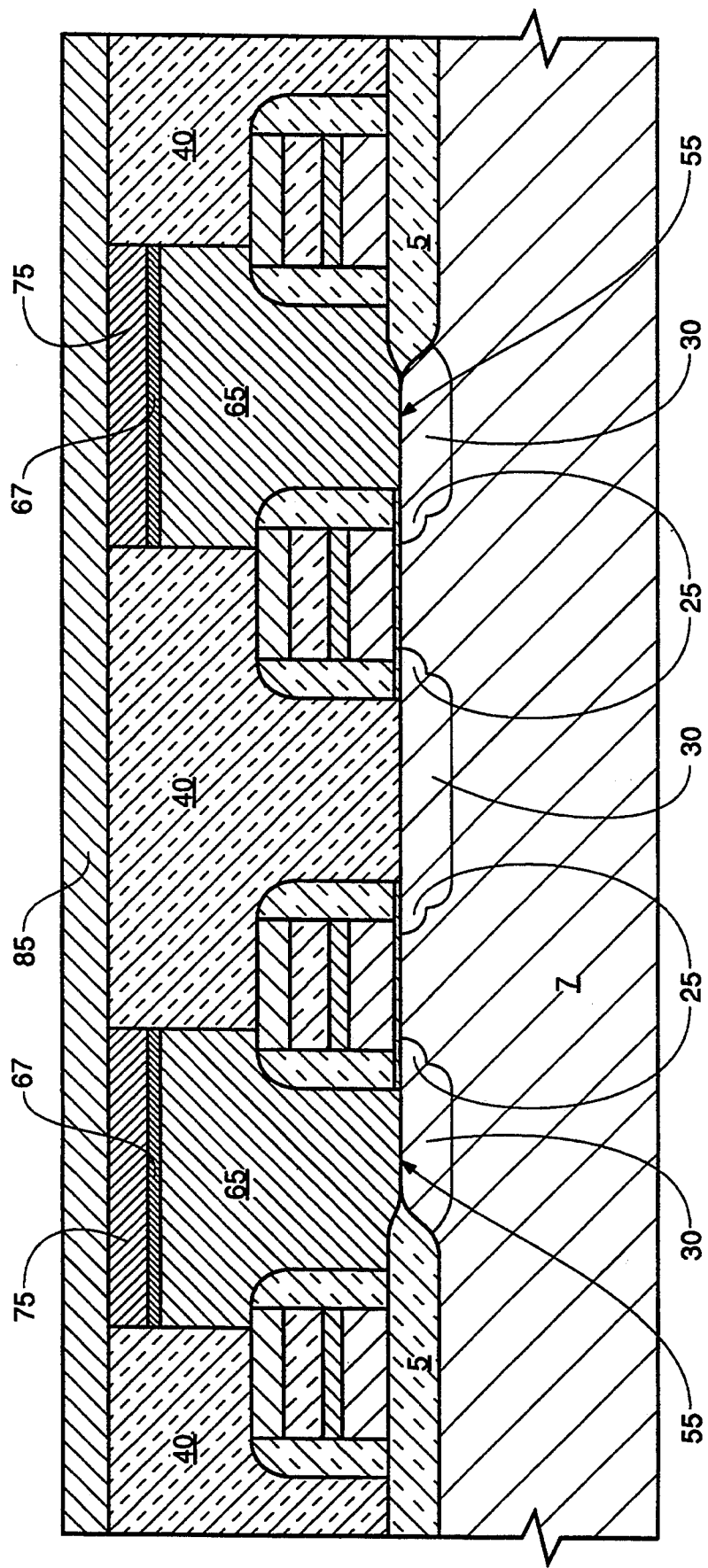
FIGS. 11A and 11B are wafer portions of FIGS. 10A and 10B following the deposition of a platinum layer.
Figure 11B:
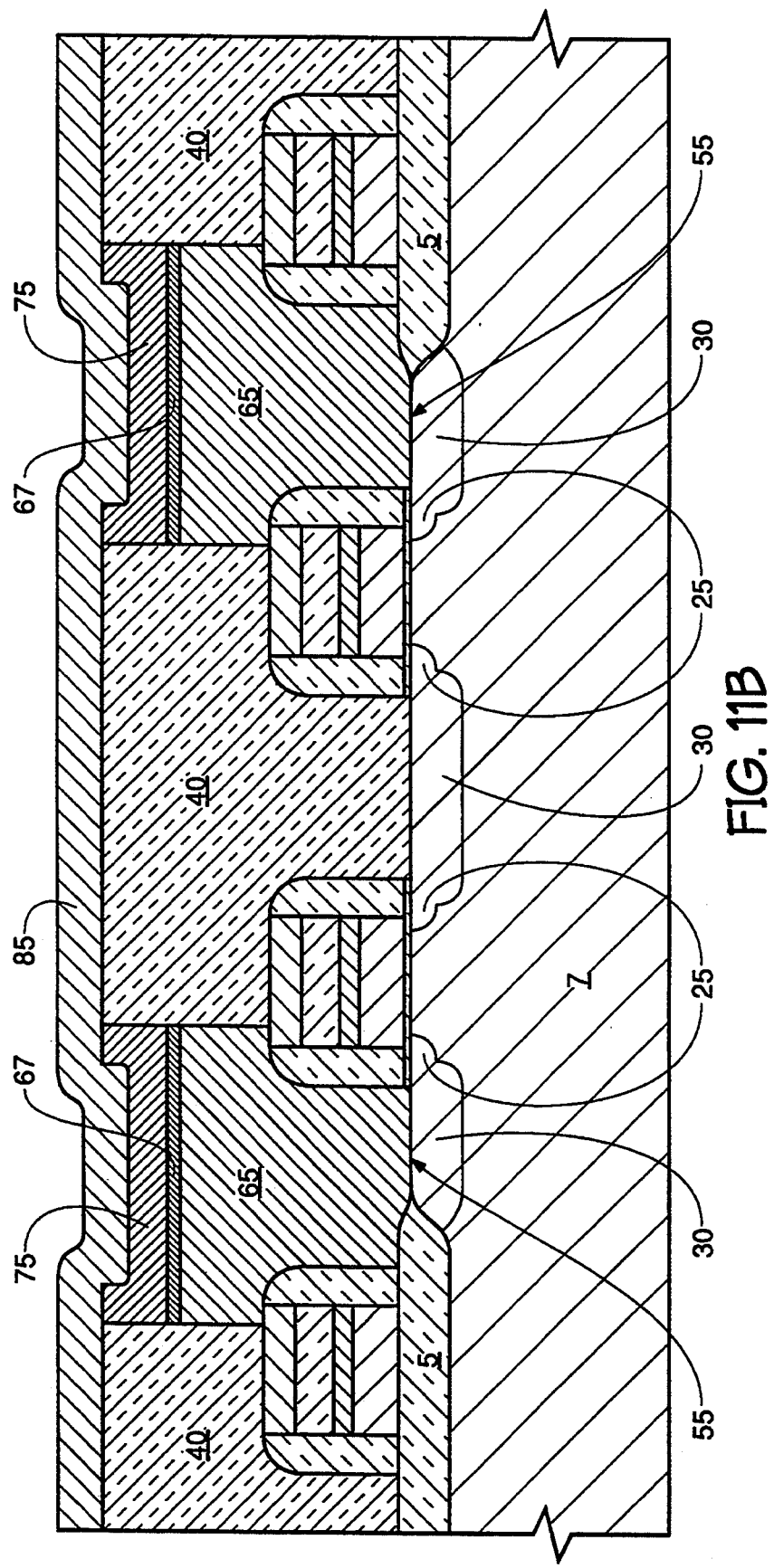

Referring to FIGS. 11A and 11B a platinum layer 85 is formed at room temperature by CVD or a sputtering technique. The platinum layer 85 overlies the titanium nitride layer 75 shown in FIGS. 10A and 10B, respectively. Since the platinum layer 85 is resistant to oxidation it provides an excellent surface for the deposition of the high dielectric constant material. In addition, the platinum layer 85 protects the top surface of the titanium nitride layer 75 from strong oxidizing conditions during the BST deposition. Therefore platinum is used as the upper portion of the first electrode since it will not oxidize during a BST deposition or subsequent anneals. An electrode that oxidizes would have a low dielectric constant film below the BST, thereby negating the advantages provided by the high dielectric constant material. The titanium nitride layer is introduced to avoid Si and Pt inter-diffusion of atoms, thereby preventing the formation of SiO2 of top of the platinum surface. Other materials which are resistant to oxidation may be used in place of the platinum. For example, RuO2 as well as other non-oxidizing materials may be used. In the parent application it was erroneously stated that TiN could also be used. However, TiN cannot be used in place of platinum.

Since the titanium nitride layer is recessed in the oxide layer 40, a thick layer of platinum may be deposited without decreasing the density of the device. By using very thick platinum electrodes, the capacitance area is increased by the sidewall area contribution. Therefore, the platinum is deposited from at least a thickness of 50 nm to a thickness of 1 micro meter($\mu$m).

Figure 12A:
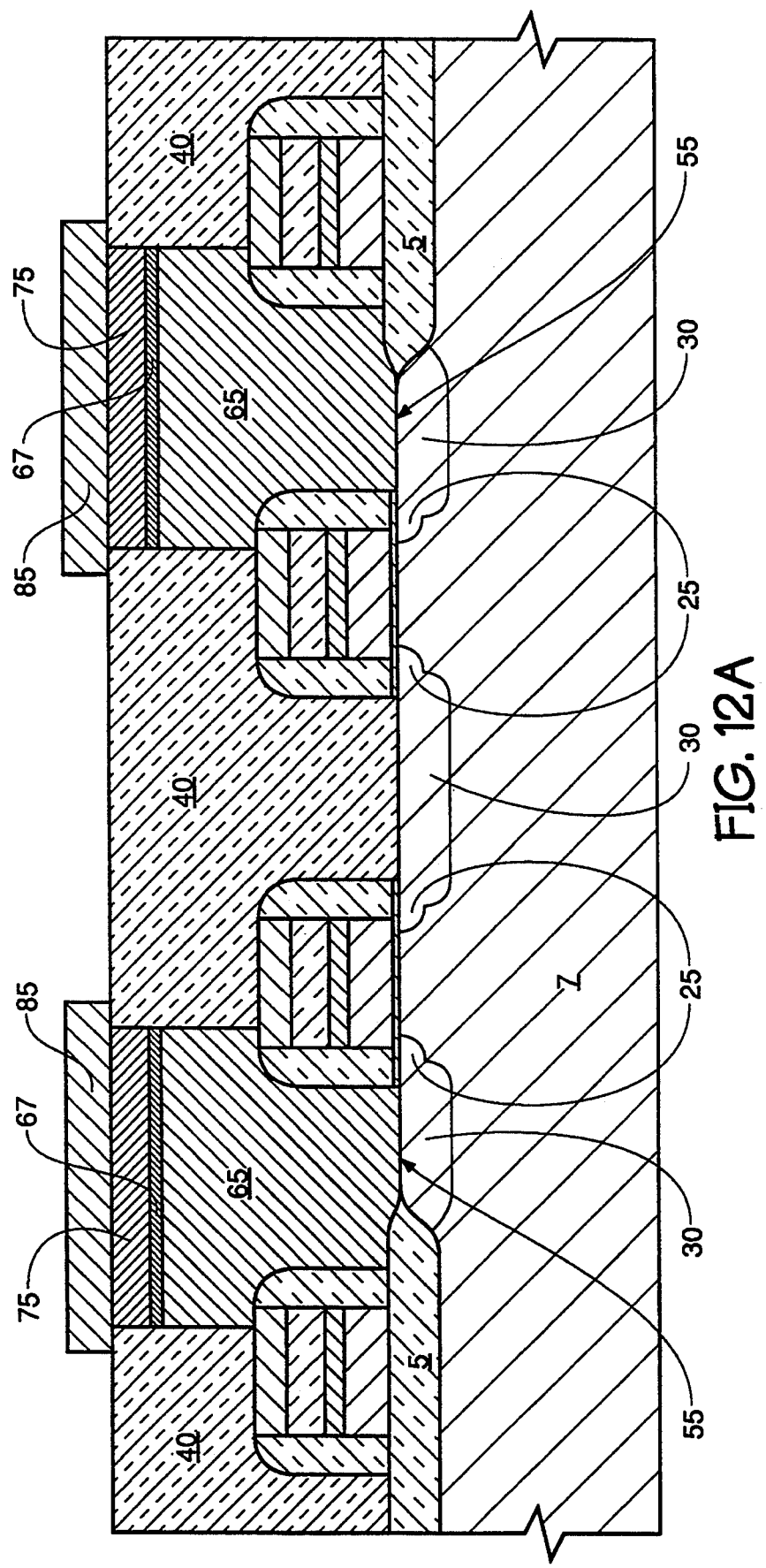
FIGS. 12A and 12B are the wafer portions of FIG. 11A and 11B, respectively, following the planarization of the platinum layer to complete the formation of the storage node.
Figure 12B:
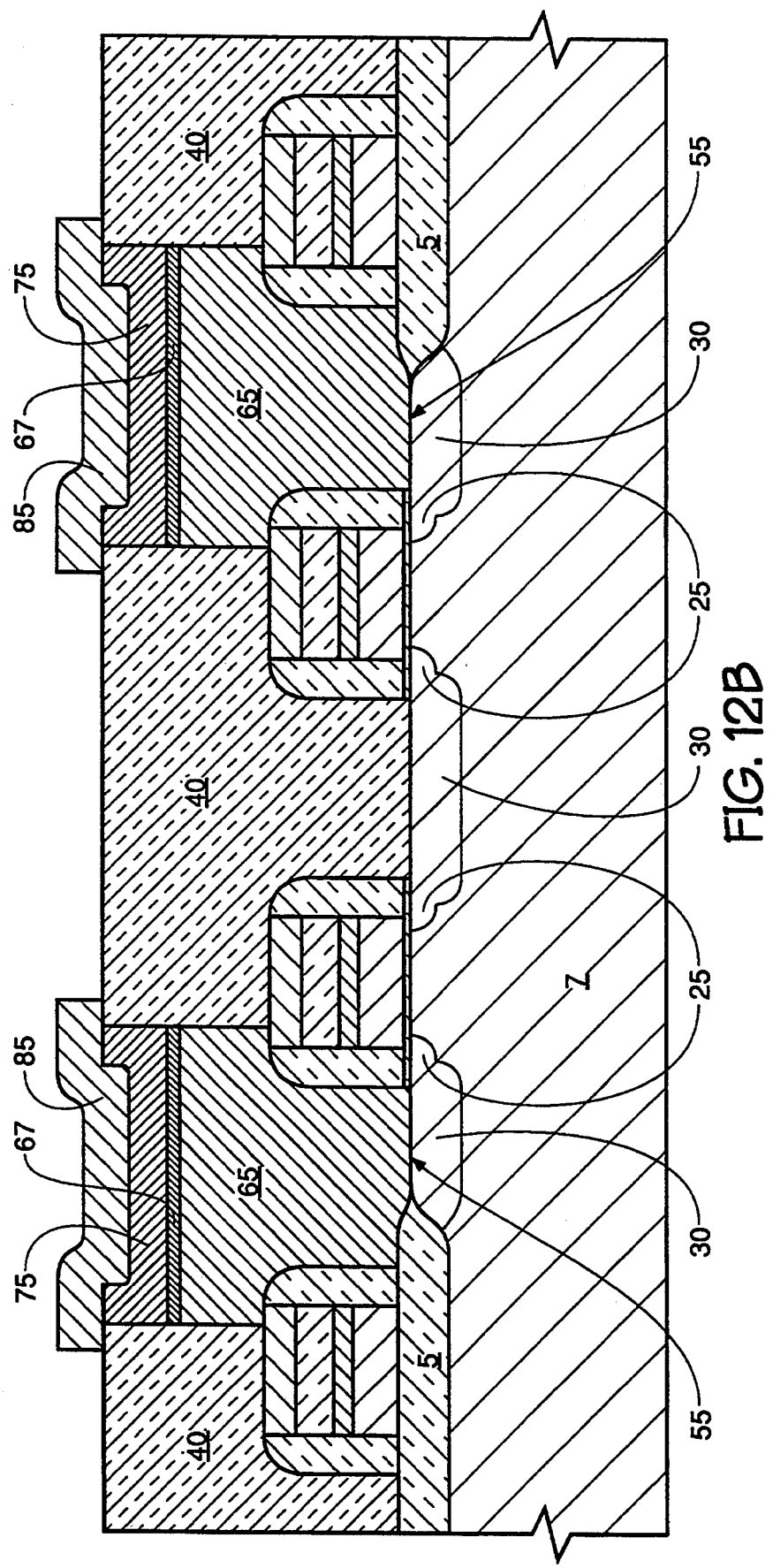

FIGS. 12A and 12B depict the structure following the masking of the platinum layer 85 overlying the titanium nitride and the removal of unmasked portions of the platinum layer 85 to form the completed storage node electrode of the storage cell capacitor. Typically the unmasked platinum is removed during a dry etch using Hbr gas. Typically the storage node electrode is thought of as comprising the titanium nitride layer 75 and the platinum layer 85. The polysilicon plug 65 is often thought of as an electrical interconnect interposed between the substrate and the storage node electrode, although it can be thought of as a portion of the storage node itself.

Figure 13A:
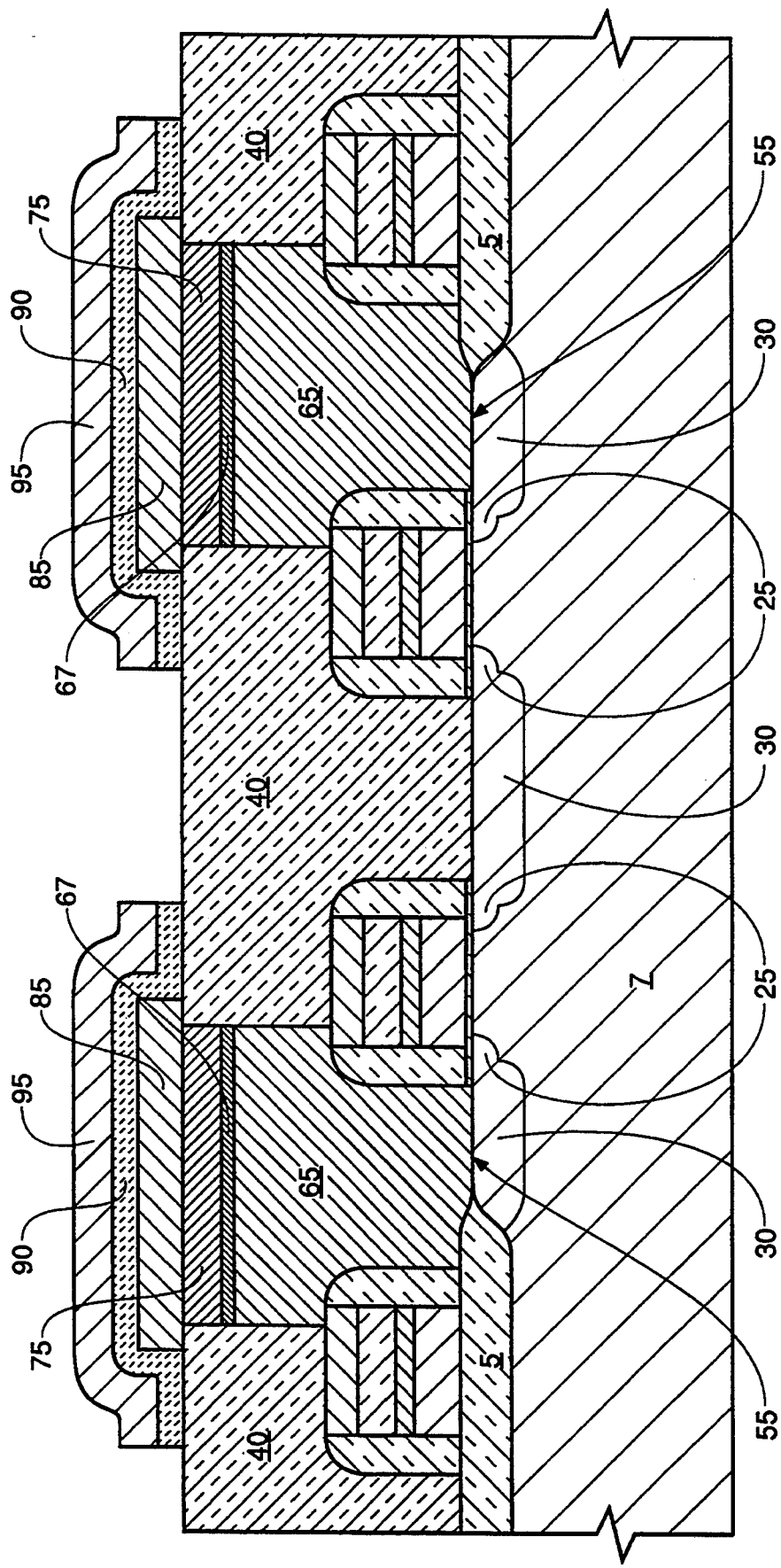
FIGS. 13A and 13B are wafer portions of FIGS. 12A and 12B, respectively, following the deposition of a BST dielectric layer and a cell plate layer and patterning of these layers to complete the formation of the storage cell capacitor.
Figure 13B:
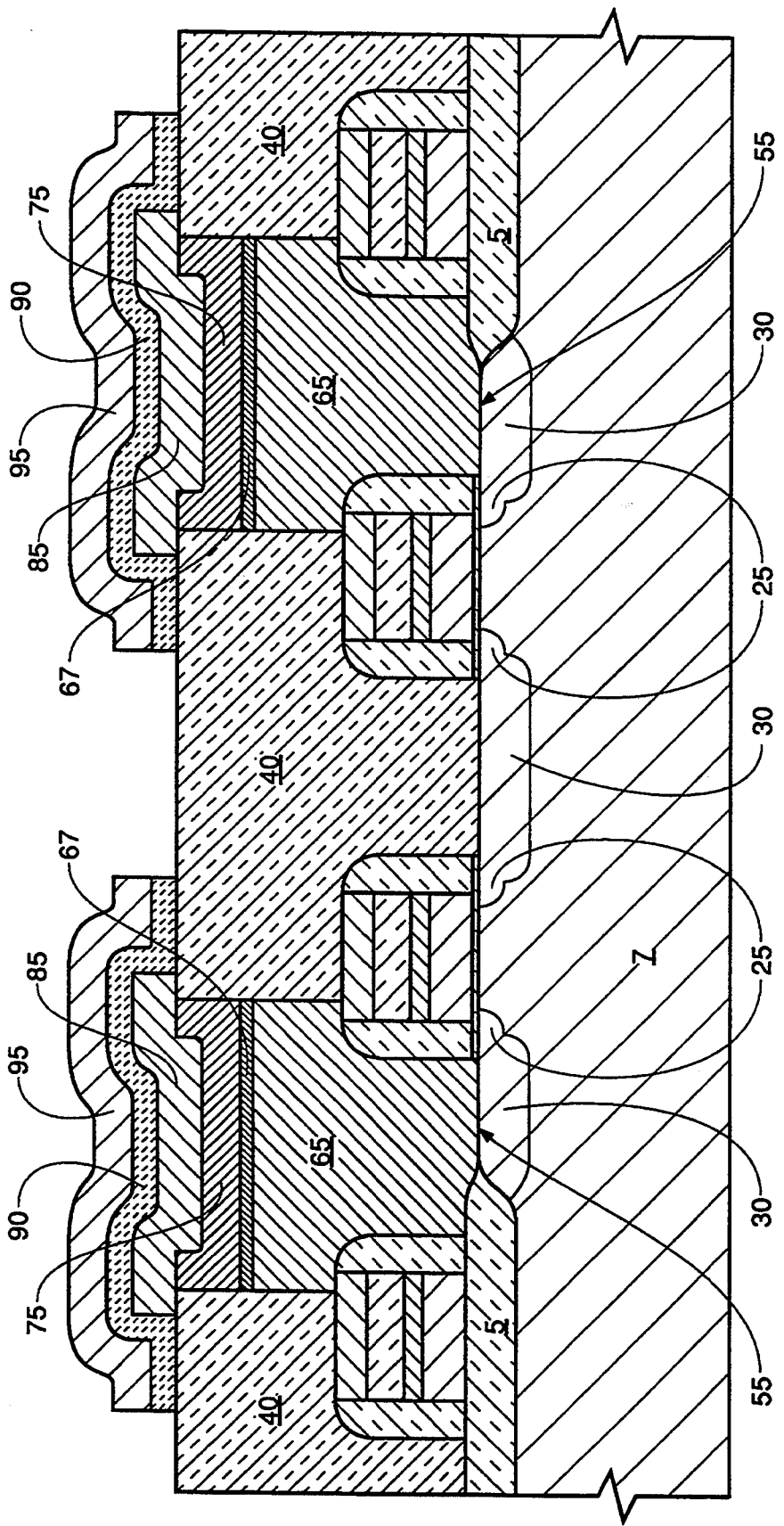

FIGS. 13A and 13B depict the storage cell capacitor following a deposition and anneal of a dielectric layer 90 overlying the platinum layer 85 of FIGS. 12A and 12B, respectively. The dielectric layer is typified as having a high dielectric constant. The storage cell capacitor fabrication is completed with the sputter or CVD of a 50 to 200 nm thick cell plate layer 95 to form a cell plate electrode. The cell plate layer 95 is typically Platinum, TiN or some other conductive material.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In the applicant's invention BST is the preferred material and is deposited at a thickness within the range of 30 nm–300nm by RF-magnetron sputtering or deposited by chemical vapor deposition (CVD) in a vapor environment at a temperature within the range of temperatures between 200 and 800 degrees Celsius. The actual vapor environment and temperature may vary for the specific dielectric being deposited. These variations are well known to those skilled in the art. The titanium nitride layer 75 is not oxidized during the application of a high temperature anneal due to the fact that it is protected from the vapor environment on its sidewalls 80 by the oxide layer 40 and that it is protected on its upper surface by the platinum layer 85, see FIGS. 11. Therefore even after the formation of the dielectric layer the recess retains the original titanium nitride 75 formed therein and capacitance is not sacrificed as it would be when portions of the titanium nitride 75 are consumed by oxidation. Therefore capacitance is effectively increased over methods where portions of titanium nitride are oxidized.

The process can be continued or modified to accommodate the steps described in U.S. Pat. No. 5,168,073, previously incorporated by reference, for providing electrical interconnection between a plurality of capacitors thus formed.

By utilizing the method of the preferred embodiments of the invention, a high density memory device is provided featuring a stacked capacitor formed in a compact area as a result of a dielectric layer having a high dielectric constant. The method of the invention provides retention of storage node integrity during an anneal of the dielectric layer.

Although alternate processes have been described for forming the storage cell capacitor it is apparent the processes are equally applicable for the fabrication of other types of capacitors used in integrated circuits. It should also be apparent to one skilleld in the art that changes and modifications may be made hereto without departing from the spirit and scope of the invention as claimed.

What is claimed is:

1. A capacitor having a storage node electrode, comprising:
   a) a plug region having a bottom surface, a top surface, and a sidewall, said bottom surface contacting a substrate, said sidewall adjacent to an electrically insulative region, and said top surface recessed from a top surface of said electrically insulative region;
   b) a diffusion barrier region overlying said plug rigid, said diffusion barrier region having at least a portion of a top surface substantially planar to said top surface of said electrically insulative region;
   c) a contact region interposed between said diffusion barrier region and said plug region; said contact region minimizing an electrical resistance between said diffusion barrier region and said plug region; and
   d) protective region selected in order to prohibit oxidation of said storage node electrode, said protective region overlying said diffusion barrier region, said diffusion barrier region minimizing diffusion of atoms between said plug and said protective region, said plug region, said diffusion barrier region, said contact region and said protective region forming the storage node electrode.

2. The capacitor as specified in claim 1, further comprising a dielectric layer overlying said protective region and physically isolated at all points from said diffusion barrier region.

3. The capacitor a specified in claim 2, wherein said dielectric layer has a dielectric constant greater than 50.

4. The capacitor as specified in claim 2, further comprising a conductive layer overlying said dielectric layer said conductive layer forming a cell plate of the capacitor.

5. The capacitor as specified in claim 2, wherein said dielectric layer is a material chosen from a group of materials consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $KNO_3$, and $LiNbO_3$.

6. The capacitor as specified in claim 1, wherein said diffusion barrier region prohibits silicon diffusion.

7. The capacitor as specified in claim 1, wherein said diffusion barrier is a material selected from groups consisting of refractory metals, conductive metal oxides, and metal nitrides.

8. The capacitor as specified in claim 1, wherein said diffusion barrier is a material selected from a group of materials consisting of Ta, TiN, TaN, Ti, $RuO_2$, Ru.

9. The capacitor as specified in claim 1, wherein said protective region is a material selected from non-oxidizing materials and conductive oxides.

10. The capacitor as specified in claim 1, wherein said protective region is a material selected from a group consisting of platinum and with $RuO_2$.

11. The capacitor as specified in claim 1, wherein said contact rigid is a material selected from a group of materials consisting of refractory metals and metal nitrides.

12. The capacitor as specified in claim 1, wherein said contact rigid is a material selected from a group consisting of Ti, W, Co, Ta, and Mo.

13. The capacitor as specified in claim 1, wherein said contact region is a material which forms a silicide with a silicon during a thermal anneal.

14. The capacitor as specified in claim 1, wherein said plug region is doped polysilicon.

15. A capacitor having a storage node electrode, comprising:
   a) a plug region having a bottom surface, a top surface, and a sidewall, said bottom surface contacting a substrate, said sidewall adjacent to an electrically insulative region, and said top surface recessed from a top surface of said electrically insulative region;
   b) a diffusion barrier region overlying said plug region, said diffusion barrier region having at least a portion of a top surface substantially planar to said top surface of said electrically insulative region;

c) a contact region interposed between said diffusion barrier region and said plug region, said contact region minimizing an electrical resistance between said diffusion barrier region and said plug region; and d) protective region selected in order to prohibit oxidation of said storage node electrode during annealing performed during a fabrication of the capacitor, said protective region overlying said Lop surface of said diffusion barrier region in its entirety and overlying portions of said electrically insulative region at all points surrounding said diffusion barrier region, said diffusion barrier region minimizing diffusion of atoms between said plug region and said protective region, said plug region, said diffusion barrier region, said contact region and said protective region forming the storage node electrode.

* * * * *